US006683369B2

(12) United States Patent
Iwamoto

(10) Patent No.: US 6,683,369 B2
(45) Date of Patent: Jan. 27, 2004

(54) SEMICONDUCTOR CHIP HAVING A SUPPORTING MEMBER, TAPE SUBSTRATE, SEMICONDUCTOR PACKAGE HAVING THE SEMICONDUCTOR CHIP AND THE TAPE SUBSTRATE

(75) Inventor: Naofumi Iwamoto, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/197,529

(22) Filed: Jul. 18, 2002

(65) Prior Publication Data

US 2003/0017654 A1 Jan. 23, 2003

(30) Foreign Application Priority Data

Jul. 19, 2001 (JP) ........................................ 2001-219182

(51) Int. Cl.[7] .............................................. H01L 23/495
(52) U.S. Cl. ........................................ 257/676; 257/692
(58) Field of Search ................................ 257/666, 670, 257/676, 692, 787, 671, 691

(56) References Cited

U.S. PATENT DOCUMENTS

| 5,635,756 A | * | 6/1997 | Kohno et al. |
| 6,208,022 B1 | * | 3/2001 | Tamura |

FOREIGN PATENT DOCUMENTS

| JP | 8-46313 | 2/1996 | ............ H05K/1/14 |
| JP | 11-87423 | 3/1999 | ............ H01L/21/60 |
| JP | 2000-195900 | 7/2000 | ............ H01L/21/60 |
| JP | 2000-243785 | 9/2000 | ............ H01L/21/60 |
| JP | 2001-110951 | 4/2001 | ............ H01L/23/34 |

* cited by examiner

Primary Examiner—Phuc T. Dang
(74) Attorney, Agent, or Firm—Junichi Mimura

(57) ABSTRACT

A semiconductor chip includes a substrate having a main surface, the main surface including a flame-shaped first area, which is along sides of the main surface, and a second area encompassed by the first area, a pad formed in the first area and a bump electrode formed on the pad, and at least one supporting member formed in the second area.

17 Claims, 12 Drawing Sheets

SEMICONDUCTOR CHIP HAVING A SUPPORTING MEMBER, TAPE SUBSTRATE, SEMICONDUCTOR PACKAGE HAVING THE SEMICONDUCTOR CHIP AND THE TAPE SUBSTRATE

CROSS-REFERENCE TO RELATED APPLICATION

This application claims the priority benefit of Japanese Patent Application No. 2001-219182, filed Jul. 19, 2001, the entire disclosure of which is incorporated herein by reference.

BACKGROUND OF THE INVENTION

1. Field of the Invention

The invention relates to a semiconductor chip, more particularly to a semiconductor chip having a support member. The invention further relates to a tape substrate, more particularly to a tape substrate having a support member. Moreover, the invention relates to a semiconductor package having the semiconductor chip and the tape substrate. Furthermore, the invention relates to a method of manufacturing the semiconductor chip and the semiconductor package.

2. Description of the Related Art

Referring to FIG. 20, a semiconductor chip 1 of the related arts, which is used for a semiconductor package, includes a single supporting member 4, pads 2, bump electrodes 3, each of which is formed on one of the pads 2. The pads 2 are formed on a single surface of the semiconductor chip 1, and the pads 2 are electrically connected to circuits formed in the semiconductor chip 1. The pads 2 are disposed in an area 30 along the side of the semiconductor chip 1. Each of the bump electrodes 3 has a top surface 3a and a height. An area of the top surface 3a of the bump electrode 3 is determined by assemble characteristics and a connecting resistance, and the height of the bump electrode 3 is determined by the reliability of the connection.

The semiconductor chip 1 is connected to a tape substrate 5, which is illustrated in FIG. 21, by a face-down bonding. The tape substrate includes land electrodes 6 to be connected to the bump electrodes 3 of the semiconductor chip 1, I/O lead electrodes 14, and wiring patterns 13, each of which connects one of the land electrodes 6 to one of the I/O lead electrodes 14. The shape of each land electrode 6 is determined by consideration of the reliability of the connection and the arraignment with the bump electrode 3. In this illustrative structure, the land electrode 6 is square. The surface of the land electrode may be metal plated. Generally, the number of bump electrodes 3 is the same as that of the land electrodes 6. Thus, each of the bump electrodes 3 corresponds to one of the land electrodes 6. Therefore, the positions of the land electrodes 6 are determined by the positions of the bump electrodes 3.

Referring to FIG. 22, the bump electrodes 3 of the semiconductor chip 1 are aligned with the land electrodes 6 of the tape substrate 5, and then, the semiconductor chip 1 is fixed on the tape substrate 5 by the face-down bonding using a conductive paste. The semiconductor chip 1 may be fixed on the tape substrate 5 using a thermal compression method. By the process described above, the semiconductor chip 1 is connected to the tape substrate 5 electrically and physically.

Then, as shown in FIG. 23, resin material 7 is injected from the side of the semiconductor chip 1 into a gap formed between the semiconductor chip 1 and the tape substrate 5. The resin material 7 goes into the gap by the capillary phenomenon until the gap is filled A semiconductor package 70 shown in FIG. 24 is completed by the above described process. In the process for manufacturing the semiconductor package 70, it is important to completely fill the gap with the resin material 7 without creating void as shown in FIG. 25.

After that, external land electrodes 6a, which are electrically connected to the land electrodes 6 by wiring pattern 13, I/O leads 14, and internal wires formed in the tape substrate 5, are formed on the back surface of the tape substrate 5. Then, a solder ball 8 is formed on each of the external land electrodes 6a. As a result, a tape BGA type semiconductor package illustrated in FIG. 26 is completed.

However, as shown in FIG. 27, according to the tape BGA type semiconductor package having the structure described above, the tape substrate 5 is transformed during the process in which the semiconductor chip 1 is fixed on the tape substrate, because of the influence of heat or pressure. When the tape substrate 5 is transformed, the following problems occur.

(1) The gap between the tape substrate 5 and the semiconductor chip 1 may not be filled with the resin material 7 completely because the gap narrows. Even if the gap between the tape substrate 9 and the semiconductor chip 1 is filled with the resin material 7 completely, the thickness of the resin material 7 may not be sufficient in some parts of the gap. As a result, water vapor resistance and strength of transverse may be decreased, and light blocking effect may also be reduced so that the semiconductor chip may malfunction.

(2) In the tape BGA structure, the length from the external land electrode 6a to the surface of an assemble substrate 9 on which the semiconductor package is mounted, varies so that some solder balls 8 may not reach terminals formed on the assemble substrate 9.

SUMMARY OF THE INVENTION

An objective of the invention is to resolve the above-described problem and to provide a semiconductor chip having a support member, a tape substrate, a semiconductor package having the chip and the substrate and a method of manufacturing them.

The objective is achieved by a semiconductor chip having a substrate including a main surface, the substrate including on the main surface a flame-shaped first area, which is along sides, and a second area encompassed by the first area, a pad formed in the first area, a bump electrode formed on the pad and at least one supporting member formed on the second area.

The objective is further achieved by a tape substrate having a tape including a main surface, the tape including a flame-shaped first area on the main surface, and a second area encompassed by the first area, a land electrode formed in the first area, an I/O electrode formed in the first area, a wiring pattern formed in the first area, the wiring pattern connecting the land electrode to the I/O electrode, a resist pattern formed on the wiring patter, and at least one supporting member formed in the second area.

The objective is moreover achieved by a semiconductor package having the semiconductor chip described above, a tape substrate, which has a main surface and a buck surface opposite to the main surface, having a land electrode on the main surface, the land electrode is connected to the bump electrode, and resin material introduced into a gap, which is formed between the substrate and the tape substrate.

The objective is achieved by a method of manufacturing a semiconductor chip having providing a substrate having a main surface, the substrate including on the main surface a flame-shaped first area, which is along sides, and a second area encompassed by the first area, forming a pad in the first area, forming a bump electrode on the pad, and forming at least one supporting member on the second area.

BRIEF DESCRIPTION OF THE DRAWINGS

The invention will be more particularly described with reference to the accompanying drawings, in which.

DETAILED DESCRIPTION OF THE PREFERRED EMBODIMENTS

In the first through tenth embodiments and in the description of the related arts, the same reference numbers designate the same or similar components.

First Embodiment

Figure 1:
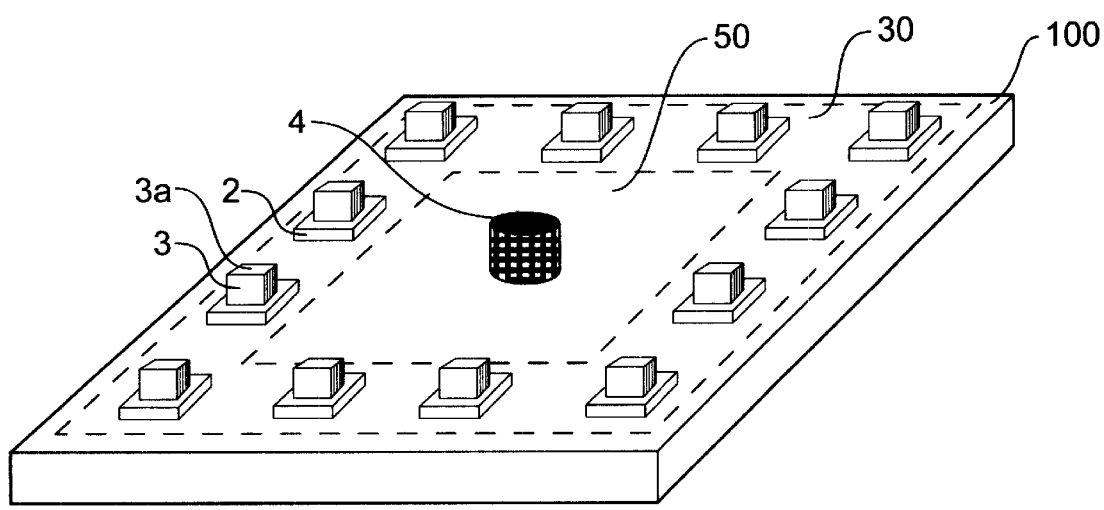
FIG. 1 is a perspective view of a semiconductor chip according to a first embodiment of the invention.

Referring to FIG. 1, a semiconductor chip 100 includes a single cylinder-shaped supporting member 4, pads 2, and bump electrodes 3, each of which is formed on one of the pads 2. The pads 2 are formed on a single surface of the semiconductor chip 1, and the pads 2 are electrically connected to circuits formed in the semiconductor chip 1. The pads 2 are disposed in a flame-shaped area 30 along the sides of the semiconductor chip 1. Each of the bump electrodes 3 has a top surface 3a and a height. An area of the top surface 3a of the bump electrode 3 is determined by the assemble characteristics and the connecting resistance, and the height of each bump electrode 3 is determined by the reliability of the connection. The supporting member 4 is formed on the same surface where the bump electrodes 3 are formed. In FIG. 1, since the bump electrodes are formed at regular intervals, the support member 4 may be located anywhere in an area 50, which is encompassed by the area 30, preferably at the center of the area 50. However, if the bump electrodes 3 are formed at irregular intervals, the support member 4 is preferably located at a certain station, which is spaced from each bump electrode 3 equally, or its vicinity. In this embodiment, although only the single support member 4 is formed, a plurality of support members may be formed in the area 50. Further, although the support member 4 is cylinder-shaped in this embodiment, the support member 4 can be formed in any shape. As described above, although the number and the shape of the support member can be changed, the number and the shape should be designed in consideration for a total area where the support members are formed and the total area where the support members are occupied within the area 50. If the support members are formed with high density or the occupancy rate of the support members in the area 50 is high, the flow of resin material, which is introduced later, is interfered by the support members.

Figure 2:
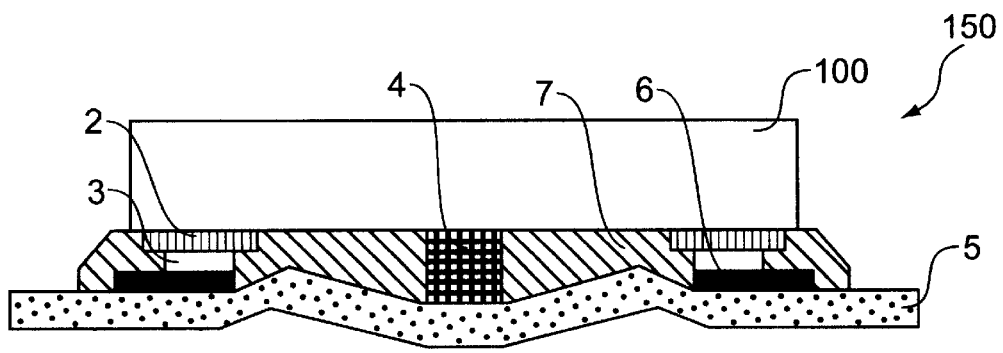
FIG. 2 is a cross-sectional view of the semiconductor chip shown in FIG. 1, which is mounted on a tape substrate.

The height of the support member 4 is equal to or less than a total thickness of the pad 2, the bump electrode 3 and a land electrode 6, which is formed on a tape substrate 5 (the land electrode 6 and the tape substrate 5 are illustrated in FIG. 2). In other words, the height of the support member 4 is designed for planarizing the tape substrate 5 when the semiconductor chip 100 is mounted on the tape substrate 5. The tape substrate 5 is formed of an insulating film or an elastic ceramic plate.

The support member 4 is formed of insulating material, semiconductor material, metal or the same material as that of the bump electrode 3. The material of the support member 4 can be selected and determined by the area where the support member 4 is formed or by the method of forming the support member 4.

Referring to FIG. 2, the semiconductor chip 100 having the support member 4 is mounted on the tape substrate 5. The tape substrate 5 includes land electrodes 6 to be connected to the bump electrodes 3 of the semiconductor chip 100, I/O lead electrodes, and wiring patterns, each of which is connected one of the land electrodes 6 to one of the I/O lead electrodes. The shape of the land electrode 6 is determined by considering the reliability of the connection and the arraignment with the bump electrode 3. In this embodiment, the land electrode 6 is square-shaped. The surface of the land electrode 6 may be metal plated. The number of bump electrodes 3 is the same as that of the land electrodes 6. Thus, each of the bump electrodes 3 corresponds to one of the land electrodes 6. Therefore, the position of the land electrodes is determined by the position of the bump electrodes 3.

As shown in FIG. 2, the bump electrodes 3 of the semiconductor chip 100 are aligned with the land electrodes 6 of the tape substrate 5, and then, the semiconductor chip 100 is fixed on the tape substrate 5 by the face-down bonding using the conductive paste. The semiconductor chip 1 may be fixed on the tape substrate 5 by a thermal compression method. By the process described above, the semiconductor chip 100 is connected to the tape substrate 5 electrically and physically. Simultaneously, one end of the support member 4 reaches the surface of the tape substrate 5, and the semiconductor chip 100 is supported by the supporting member 4.

When the semiconductor chip 100 is fixed on the tape substrate 5 by the thermal compression method, each bump electrode 3 and the corresponding land electrode 6 are thermally transformed by heat, and in this state, the transformed bump electrode 3 and the corresponding transformed land electrode 6 are connected to each other with a compression force. As described in the related art, the tape substrate 5 may also be transformed by this heat and compression force. However, even if the tape substrate 5 is transformed, a gap formed between the semiconductor chip 100 and the tape substrate 5 can be secured compellingly by the supporting member 4, as illustrated in FIG. 2.

Next, resin material 7 is introduced from the side of the semiconductor chip 100 into the gap compellingly, which is created by the support member 4 between the semiconductor chip 100 and the tape substrate 5. The resin material 7 goes into the gap by the capillary phenomenon until the gap is filled completely. A semiconductor package 150, generally called a COF (Chip on Film), shown in FIG. 2, is completed by the above-described process.

According to the first embodiment, since the supporting member 4 is formed on the surface of the semiconductor chip 100, the gap between the semiconductor chip 100 and the tape substrate 5 can be formed when the semiconductor chip 100 is mounted on the tape substrate 5 even if the tape substrate 5 is transformed by heat. Thus, since the flow of the resin material 7 is not interfered, the gap is filled with the resin material completely. As a result, water vapor resistance and strength of transverse may be maintained even if the tape substrate 5 is transformed by heat, and light blocking effect may not be reduced so that the semiconductor chip may not malfunction.

Figure 3:
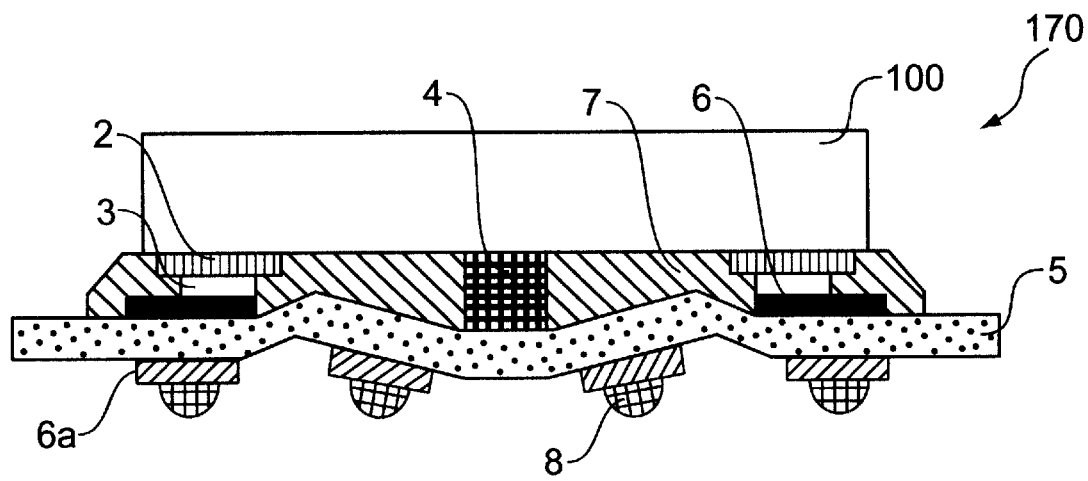
FIG. 3 is a cross-sectional view of a semiconductor package having the semiconductor chip shown in FIG. 1.

A tape BGA type semiconductor package 170 having the semiconductor package illustrated in FIG. 2 is formed in a following method, with reference to FIG. 3. Before the semiconductor chip 100 is mounted on the tape substrate 5, external land electrodes 6a are formed on a surface of the tape substrate 5 opposite to the surface where the land electrodes 6 are formed. Each external land electrode 6a is connected to one of the land electrodes 6 by unillustrated internal wire formed in the tape substrate 5.

Next, as described above, the semiconductor chip 100 is fixed on the tape substrate 5 by the face-down bonding, and then, the resin material is introduced into the gap. After the semiconductor package 150 illustrated in FIG. 2 is completed, a solder ball 8 is formed on each external land electrode 6a to complete the tape BGA type semiconductor package 170.

Figure 6:
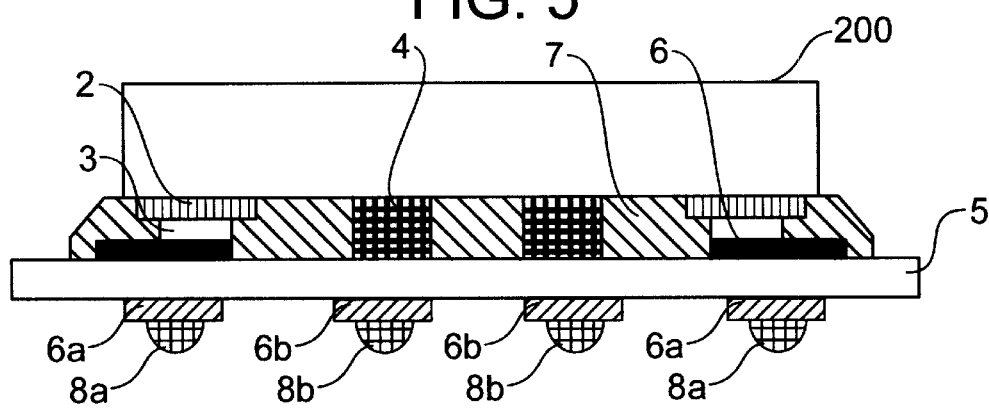
FIG. 6 is a cross-sectional view of a semiconductor package having the semiconductor chip shown in FIG. 5.

Then, as shown in FIG. 6, the tape BGA type semiconductor package 170 is connected to the assemble substrate 9 by connecting each solder ball 8 to one of terminals formed on the assemble substrate 9 using a reflow method.

According to this tape BGA type semiconductor package 170 using the semiconductor package 150 of the first embodiment, since the tape substrate 5 maintains flatness because of the support member 4, all solder balls 8 can reach the surface of the assemble substrate 9.

Second Embodiemnt

Figure 4:
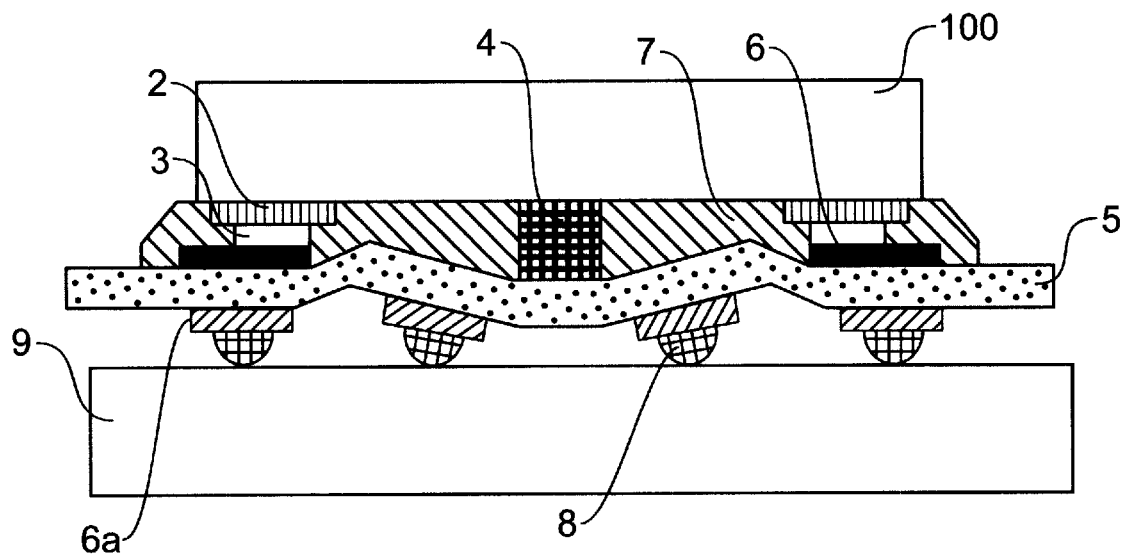
FIG. 4 is a cross-sectional view of the semiconductor package shown in FIG. 4, which is mounted on an assemble substrate.

Comparing to the first embodiment, the differences are the number support members and the place where the support members are formed. The other components illustrated in FIGS. 3 and 4, are the same as the components used in the first embodiment.

The second embodiment is explained with reference to FIGS. 5 and 6. As shown in FIG. 6, first external land electrodes 6a, second external land electrodes 6b, first solder balls 8a and second solder balls 8b are formed on a surface of a tape substrate 5. The first external land electrodes 6a are formed in a first area, which corresponds to an area 30 in a semiconductor chip 200 where bump electrodes 3 are formed, and the second external land electrodes 6b are formed in an area, which corresponds to an area 50 on the semiconductor chip 200 where support members 4 are formed.

Figure 5:
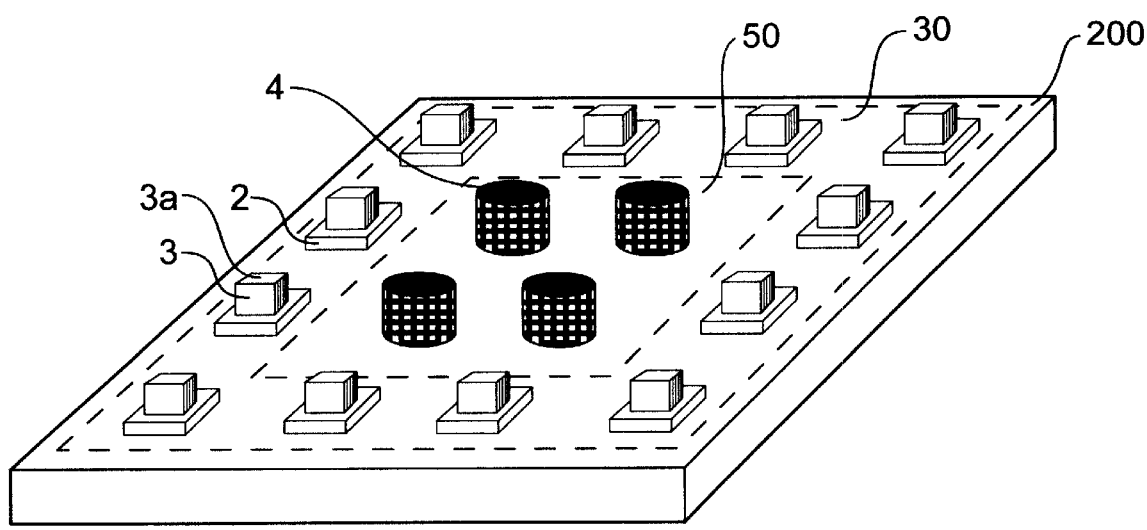
FIG. 5 is a perspective view of a semiconductor chip according to a second embodiment of the invention.

Referring to FIGS. 5 and 6, the semiconductor chip 200 includes four cylinder-shaped supporting members 4, pads 2, and bump electrodes 3, each of which is formed on one of the pads 2. The support members 4 are formed in the area 50, which is encompassed by the area 30. Each support member 4 is formed at a position, which corresponds to one of the second external land electrodes 6b. Thus, since four support members 4 are formed in the second embodiment, four second external land electrodes 6b are formed in an area corresponding t the area 50, at least. Although the number of support members 4 may be changed, each support member 4 should be located at a position, which corresponds to one of the second external land electrodes 6b. The shape and the material of each support member 4 are the same as these of the support member 4 of the first embodiment.

A semiconductor package 270 illustrated in FIG. 6 is formed by the same method described in the first embodiment. Thus, the semiconductor chip 200 of FIG. 5 is mounted on the tape substrate 5, and fixed on the tape substrate 5 by the facedown bonding, and then, the resin material 7 is introduced into a gap formed between the semiconductor chip 200 and the tape substrate 5. Then first and second solder ball 8a, and 8b are formed on the first and second external land electrodes 6a and 6b, respectively.

According to the second embodiment, since each support member 4 is formed at the position, which corresponds to one of the second land electrodes 6b, each of the second solder ball 8b is formed under one of the support members 4. Thus, the length from the tape substrate 5 to the tip of the second solder ball 8b is always the same. In other words, the length from the tape substrate 5 to the tip of the second solder ball 8b is not influenced by the transform of the tape substrate 5. As a result, all solder balls 8 can reach the surface of an assemble substrate.

Further, according to the second embodiment, when an accurate length from the tape substrate 5 to the tip of the second solder ball 8b is required due to form a small solder ball in the large semiconductor chip, the accurate length can be realize by controlling the height of each support member 4. As a result, it is possible to increase the connection reliability of the solder balls 8a, 8b to the assemble substrate.

Third Embodieent

Comparing to the first embodiment, the differences are material of support member and a method of forming the support member. The other components illustrated in FIGS. 7 and 8 are the same as the components used in the first embodiment.

The third embodiment is explained with reference to FIGS. 7 and 8. Referring to FIG. 7, a semiconductor chip 300 includes a single resin-formed supporting member 4a, pads 2, and bump electrodes 3 each of which is formed on one of the pads 2. The support member 4a is formed in an area 50, which is encompassed by an area 30 where the pads 2 and the bump electrodes 3 are formed. The support member 4a is formed preferably at the center of the area 50. A plurality of the resin-formed support members 4a may be formed. The height of the support member 4a equals a total thickness of the pad 2, the bump electrode 3 and a land electrode 6, which is formed on a tape substrate 5 as shown in FIG. 8.

Figure 7:
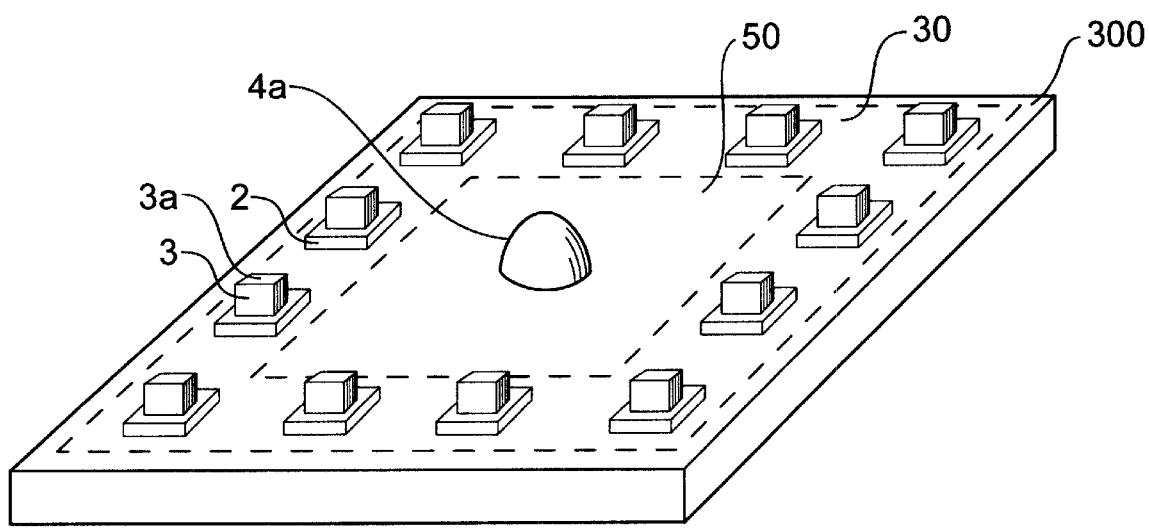
FIG. 7 is a perspective view of a semiconductor chip according to a third embodiment of the invention.
Figure 8:
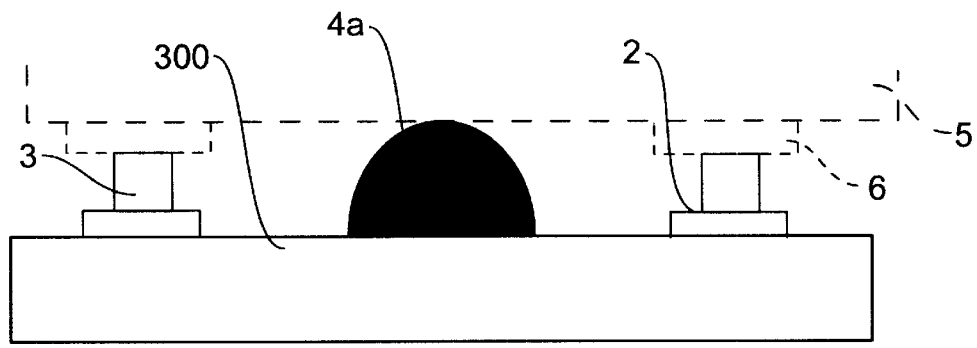
FIG. 8 is a cross-sectional view of the semiconductor chip shown in FIG. 7.

The semiconductor chip 300 shown in FIGS. 7 and 8 are formed by a following method. The semiconductor chip 300 having the pads 2 and bump electrodes 3 is prepared. Then, resin material in a liquid state is dropped at a center of the area 50, and the dropped resin material is solidified to be the resin-formed support member 4a. Then, as well as the first and second embodiments, the semiconductor chip 300 of FIG. 8 is mounted on the tape substrate 5, and fixed on the tape substrate 5 by the facedown bonding, and then, the resin material is introduced into a gap formed between the semiconductor chip 300 and the tape substrate 5.

The resin material for forming the support member 4a may be the same as the resin material, which is introduced between the gap. In this embodiment, although the resin material for forming the support member 4a is dropped, the other method can be accepted. For example, a mold having an opening may be used. In this case, the mold is placed on the surface of the semiconductor chip 300 in the area 50 while the opening is located at the center of the area 50. Then, the resin material in the liquid state flows into the opening, and solidified in the mold. When the mold is removed, the support member 4a formed of the liquid resin material remains on the surface of the semiconductor chip 300. Further, the resin-formed supporting member 4a may be formed by a screen print method. In any method, the height of the resin-formed supporting member can be controlled by the amount of the resin material.

Further, it is not necessary to solidify the supporting member 4a completely. It is sufficient to incomplete-solidify the liquid resin material if the liquid resin material does not come off or is not transformed. In such case, the incomplete-solidify resin material is solidified completely when the resin material 7 is solidified.

According to the third embodiment, in addition to the benefits of the first embodiment, since the support member 4a is formed from the liquid resin material, it is easy to form and to control the support member 4a.

Moreover, the resin-formed support member 4a may be formed at a position, which corresponds to one of the land electrodes 6. In this case, the height of the resin-formed support member 4a may equals the total thickness of the pad 2 and the bump electrode 3 or the less.

Fourth Embodiment

Figure 9:
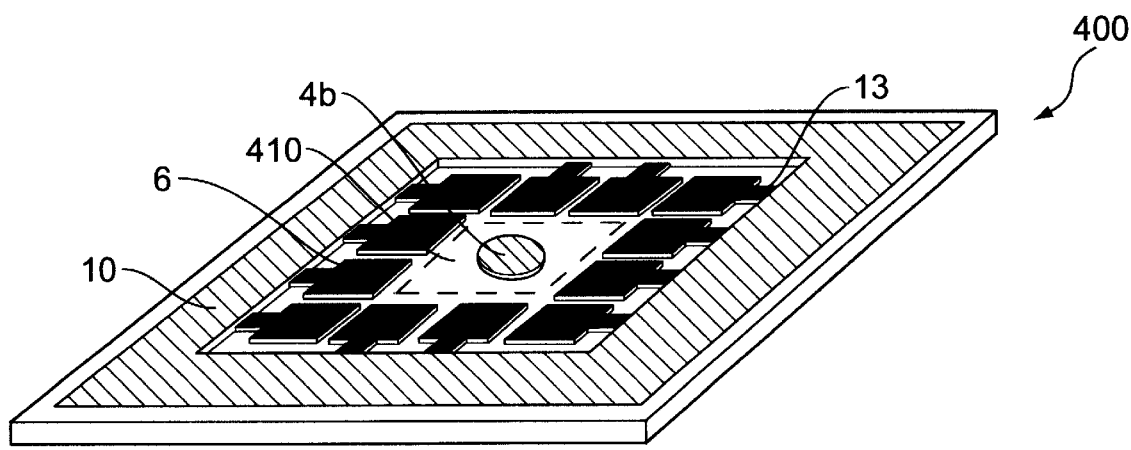
FIG. 9 is a perspective view of a tape substrate according to a fourth embodiment of the invention.
Figure 10:
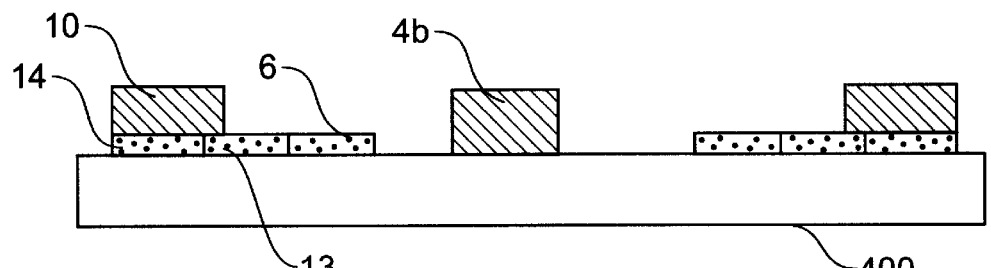
FIG. 10 is a cross-sectional view of the tape substrate shown in FIG. 9.

Referring to FIGS. 9 and 10, a tape substrate 400 includes land electrodes 6 to be connected to bump electrodes of semiconductor chip, I/O lead electrodes 14, wiring patterns 13, each of which is connected one of the land electrodes 6 to one of the I/O lead electrodes 14, a single resist-formed supporting member 4b and a flame-shaped resist film 10. The surface of each land electrode 6 may be metal plated. The land electrodes 6, the I/O lead electrodes 14, the wiring patterns 13, the resist film 10 and the single resist-formed supporting member 4b are formed on the same surface of the tape substrate 400.

The resist film 10 is formed on the surface of the tape substrate 400 between the wiring patterns 13 or between the I/O lead electrodes 14 to protect or to avoid unnecessary contacts between the wiring patterns 13 or between the lead electrodes 14. In this embodiment, when the resist film 10 is formed, a resist material, which is the same material as the resist film 10, is placed in an area 410, which is encompassed by the land electrodes 6. Then, by solidifying the resist material in the area 410, the resin-formed support member 4b is formed. The height of the resin-formed support member 4b is equal to or the less than a total thickness of the land electrode 6, the pad on the semiconductor chip and the bump electrode on the pad.

According to the fourth embodiment, since the support member 4b is formed on the tape substrate, even if a gap can be secured when the semiconductor chip in the related art is used. Further, since the support member 4b and the resist film 10 are formed simultaneously, no additional process to form the support member is not required while the gap between the semiconductor chip and the tape substrate is secured.

According to the fourth embodiment, although the single resin-formed support member 4b is formed on the tape substrate 400, a plurality of the single resin-formed support members may be formed in the area 410.

Fifth Embodiment

Figure 11:
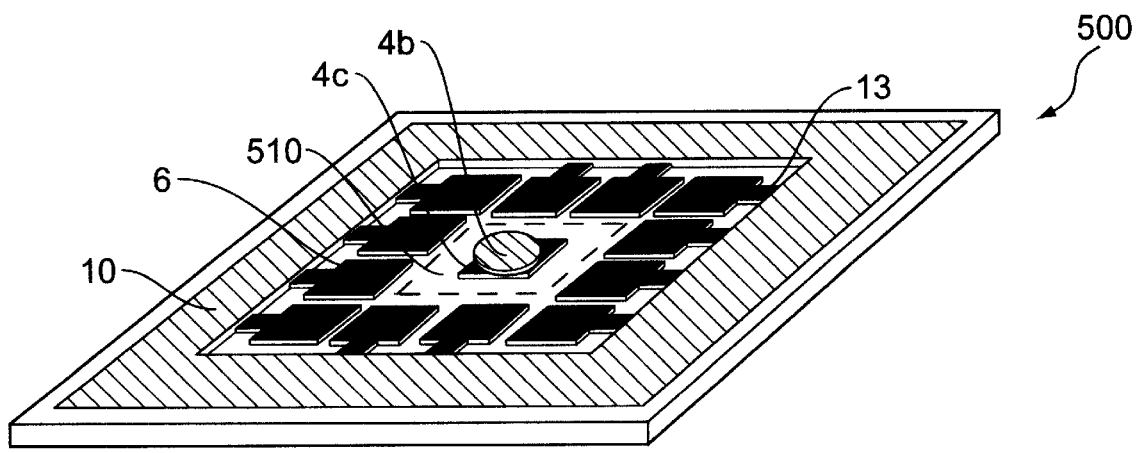
FIG. 11 is a perspective view of a tape substrate according to a fifth embodiment of the invention.
Figure 12:
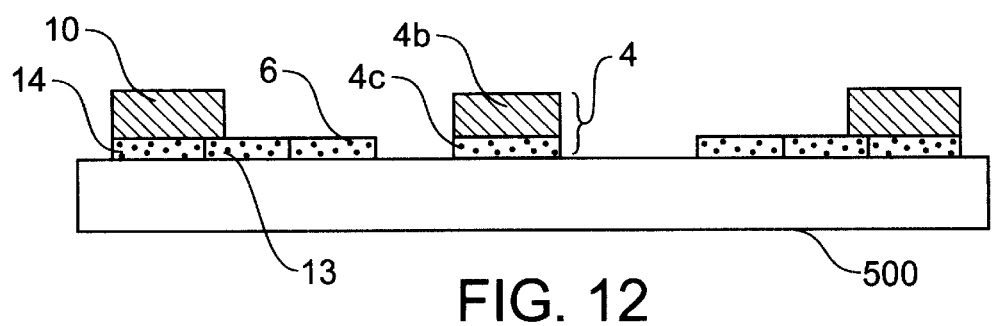
FIG. 12 is a cross-sectional view of the tape substrate shown in FIG. 11.

Comparing to the fourth embodiment, a supporting member 4 having two layers is formed in the fifth embodiment. Referring to FIGS. 11 and 12, the tape substrate 500 includes land electrodes 6 to be connected to bump electrodes of the semiconductor chip, I/O lead electrodes 14, wiring patterns 13, each of which is connected one of the land electrodes 6 to one of the I/O lead electrodes 14, a single first supporting member 4b, a single second supporting member 4c and a flame-shaped resist film 10. The surface of the land electrode 6 may be metal plated. The land electrodes 6, the I/O lead electrodes 14, the wiring patterns 13, the resist film 10 and the first and second supporting members 4b, 4c are formed on the same surface of the tape substrate 500. The second supporting member 4c is formed in an area, which is encompassed by the land electrode 6, the first supporting member 4b is formed on the second supporting member 4c.

The second supporting member 4c is formed at the same time that the wiring patterns 13 are formed. Thus, the material of the second supporting member 4c is the same as these of the wiring patterns 13. Here, the wiring patterns 13 are the same ones as described in the first through fourth embodiments. Further, the first supporting member 4b is formed at the same time that the resist film 10 is formed. Here, the resist film 10 is the same one as described in the fourth embodiment.

According to the fifth embodiment, since the supporting member 4 includes the second supporting member 4c and the first supporting member 4b stacked on the second supporting member 4c wherein the first and second supporting member 4b and 4c are formed at the same time that the wiring patters 13 and the resist film 10 are formed, respectively, no additional process to form the support member 4 is not required while a gap between he semiconductor chip and a tape substrate is secured.

Further, comparing to the fourth embodiment, the support member 4 having the sufficient height can be formed because the support member 4 includes the first and second supporting members.

Sixth Embodiment

Figure 13:
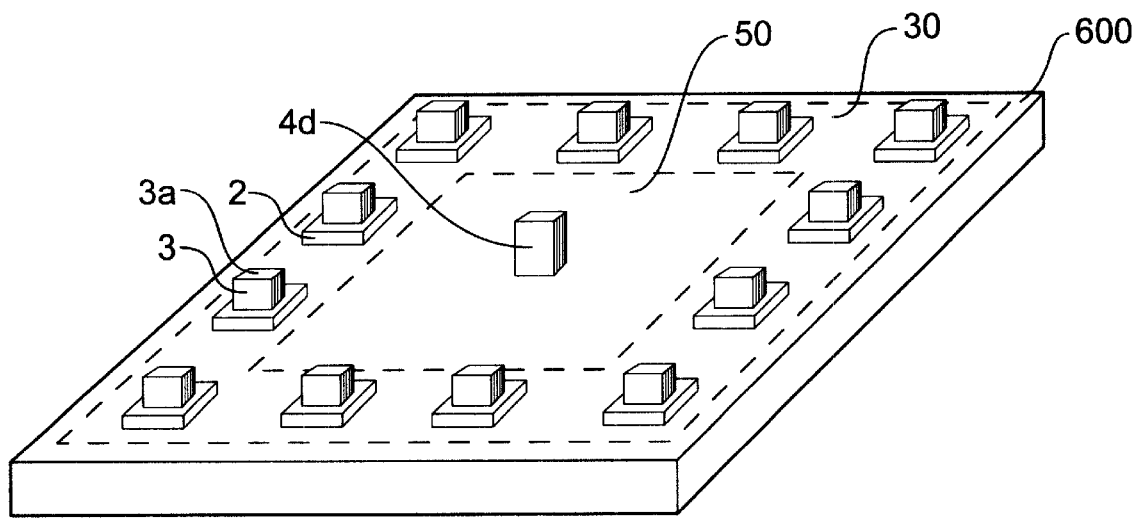
FIG. 13 is a perspective view of a semiconductor chip according to a sixth embodiment of the invention.

Comparing to the third embodiment, the difference is material of a support member. The other components illustrated in FIG. 13 are the same as the components used in the third embodiment.

The sixth embodiment is explained with reference to FIG. 13. Referring to FIG. 13, a semiconductor chip 600 includes a single metal-formed supporting member 4d, pads 2, and bump electrodes 3, each of which is formed on one of the pads 2. The support member 4d is formed in an area 50, which is encompassed by an area 30 where the pads 2 and the bump electrodes 3 are formed. The support member 4d is formed preferably at a center of the area 50. A plurality of the metal-formed support members 4d may be formed. The height of the support member 4d equals the height of the bump electrode 3. The support member 4d is formed at the same time that the bump electrodes 3 are formed. Thus, the size and the material of the support member 4d are the same as these of the bump electrode 3. The support member is isolated from any other conductive components formed on the semiconductor chip 600, and also is isolated from the conductive component formed on the tape substrate after the semiconductor chip 600 is mounted on the tape substrate. As well as the other embodiments, the plurality of the supporting members 4d may be formed under the same restrictions described in the other embodiments.

According to the sixth embodiment, since the support member 4d and the bump electrodes 3 are formed simultaneously, no additional process to form the support member is not required while a gap between the semiconductor chip 600 and the tape substrate is secured Furthermore, a following alternative of the sixth embodiment can be considered. Comparing to the sixth embodiment, the difference is a height of a support member. The other components illustrated in FIG. 14 are the same as the components used in the sixth embodiment.

Figure 14:
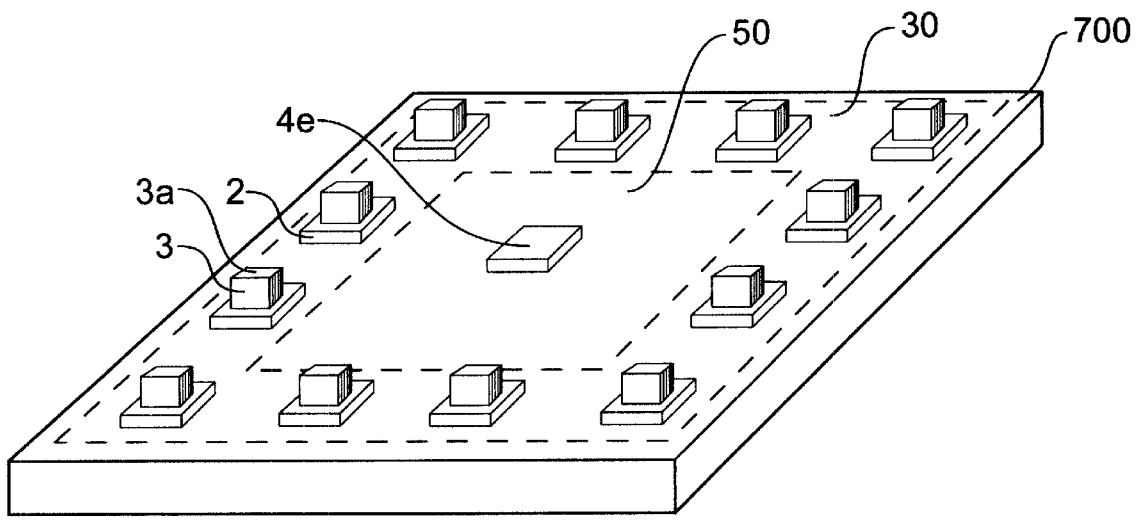
FIG. 14 is a perspective view of a semiconductor chip according to a alternative of the sixth embodiment of the invention.

Referring to FIG. 14, the support member 4e is formed in an area 50 on a semiconductor chip 700, which is encompassed by an area 30 where the pads 2 and the bump electrodes 3 are formed. The support member 4e is formed preferably at a center of the area 50. A plurality of the support members 4e may be formed. The height of the support member 4e is lower than the bump electrode 3. The support member 4e and the bump electrode 3 are formed simultaneously. Thus, the materials of the support member 4d and the bump electrodes 3 are the same. However, as described above, the heights of the support member 4d and the bump electrodes 3 are different. There are a couple of methods for forming the support member 4d and the bump electrodes 3 having different height simultaneously. For example, by plating method, metal material is grown at a bump electrode forming area and a support member forming area. After metal material is grown enough to be the support member 14, the support member 4d is masked. Then the metal material is further grown by the plating method while the support member 4d is masked. As a result, the support member 4d and the bump electrodes 3 having different height can be formed simultaneously. In the alternative method, the supporting member is formed by a single layer, and the bump electrode 3 is formed by two layers.

According to the alternative of the sixth embodiment, the supporting member 4e is formed shorter than the bump electrode. Thus, when the height of the bump electrode is shrunken at the assemble process after the semiconductor chip 700 is mounted on the tape substrate, the support member 4d will not reach to the tape substrate. As a result, the semiconductor chip 700 is not compressed by the supporting member 4d so that a passivation layer and circuits formed on the semiconductor chip 700 are not destroyed.

Seventh Embodiment

Figure 15:
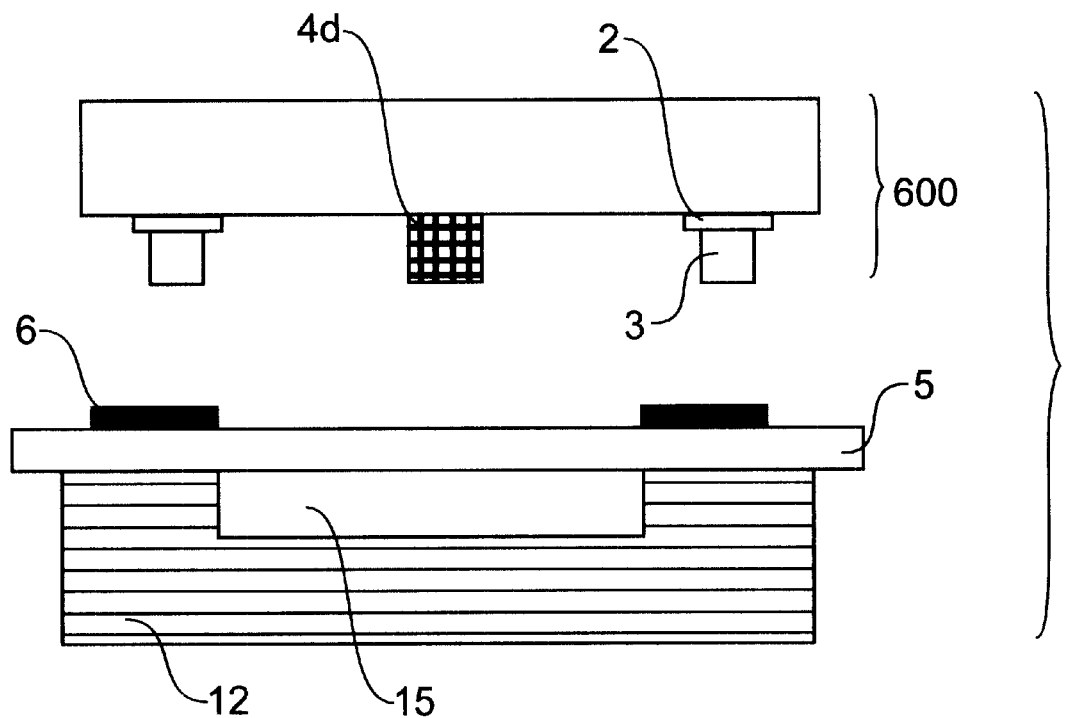
FIG. 15 is a sectional view showing a method how the semiconductor chip shown in FIG. 13 is mounted on the tape substrate, by using an assembling apparatus, according to the seventh embodiment.

FIG. 15 shows a method how the semiconductor chip 600 shown in FIG. 13 is mounted on the tape substrate 5, by using an assembling apparatus 12. As described in the first embodiment, a bump electrode 3 of a semiconductor chip 600 may be fixed on the land electrode 6 of a tape substrate 5 by a thermal compression method. Thus, stress may be applied to the semiconductor chip 600 under the bump electrode 3. Generally, since there is no circuits formed on the semiconductor chip 600 under the bump electrode 3, the thermal compression method can be used. However, in some occasions, there are circuits formed on the semiconductor chip 600 under the supporting member 4d. Thus, stress can not be applied to the semiconductor chip 600 under the supporting member 4d. So, the following method is used for fixing the semiconductor chip 600 to the tape substrate 5.

First, an assembling apparatus 12 is prepared. The assembling apparatus 12 includes a recess 15 in an area corresponding to the area 50 in the semiconductor chip 600 (See FIG. 13). Then, the tape substrate 5 is placed on the assembling apparatus 12. After that, the semiconductor chip 600 is mounted on the tape substrate 5. Here, the tip of the supporting member 4d reaches the surface of the on the tape substrate 5. Then, the semiconductor chip 600 is fixed on the tape substrate 5 by the thermal compression method. Under this method, stress may be applied to the semiconductor chip 600 under the bump electrode 3 as described above. However, stress may not be applied to the semiconductor chip 600 under the supporting member 4d because there is the recess 15 under the tape substrate 5 corresponding to the area 50 of the semiconductor chip 600. Thus, since the tape substrate 5 may be bent toward the recess 15 even if the supporting member 4d compresses the tape substrate 5, no stress is applied to the semiconductor chip 600 under the supporting member 4d. As a result, circuit formed on the semiconductor chip 600 under the supporting member 4d may not be damaged.

According to the seventh embodiment, since the assembling apparatus 12 having the recess 15 is used when the semiconductor chip 600 mounted on the tape substrate 5, the circuit formed on the semiconductor chip 600 under the supporting member 4d may not be damaged. Further, according to the seventh embodiment, if the supporting member 4d is formed higher than the total thickness of the pad 2, the bump electrodes 3 and the land electrode 6, the circuit formed on the semiconductor chip 600 under the supporting member 4d may not be damaged because the tape substrate 5 can be bent toward the recess 15. Of cause, under this embodiment, a gap between the semiconductor chip 600 and the tape substrate 5 can be secured. Accordingly, according to the seventh embodiment, relaxation of the restriction regarding the height of the supporting member 4d can be expected.

In the seventh embodiment, although the semiconductor chip 600 is used, the semiconductor chips in the other embodiments can be used.

Eighth Embodiemnt

Figure 16:
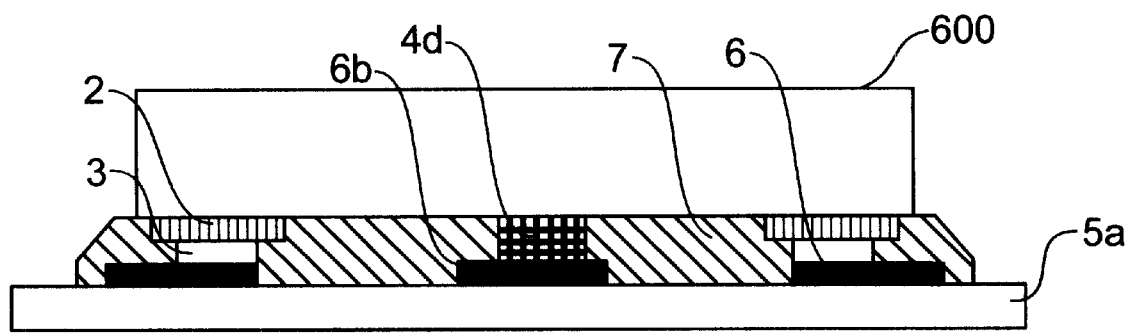
FIG. 16 is a cross-sectional view of a semiconductor package having the semiconductor chip shown in FIG. 13, according to the eighth embodiment.

By using the semiconductor chip 600 of the sixth embodiment shown in FIG. 13, the eight embodiment is described. Referring to FIG. 16, a tape substrate 5a includes a land electrode 6 and a dummy land electrode 6b, which is formed on the same surface of the land electrode 6. The land electrode 6 and the dummy electrode 6b are formed simultaneously. Thus, the material of them is the same. The dummy electrode 6b is formed in an area corresponding to the support member 4d. In this embodiment, since the single supporting member 4d is used, the single dummy land electrode 6b is used. When a plurality of the support members are used, the same number of dummy land electrodes are used. Thus, each of the dummy land electrodes 6b corresponds one of the support members 4d.

As described above and in the sixth embodiment, the support member 4d and the bump electrode 3 are formed in the same material simultaneously, and the land electrode 6 and the dummy land electrode 6b are formed of the same material simultaneously. Thus, when the semiconductor chip 600 is fixed on the tape substrate 5a by connecting the bump electrode 3 to the land electrode 6, the supporting member 4d can be connected to the dummy land electrode 6b, simultaneously. Here, as described above, since stress may be applied to the semiconductor chip 600 under the bump electrode 3 and under the support member 4d, any circuit elements may not be formed on the semiconductor chip 600 under the support member 4d. After that, a resin material 7 introduced into a gap formed between the semiconductor chip 600 and tape substrate 5a.

According to the eighth embodiment, the semiconductor chip 600 is fixed to the tape substrate 5a firmly in the area encompassed by the bump electrode 6, the gap between the semiconductor chip 600 and tape substrate 5a can be secured. Thus, the gap can be filled with the resin material 7 completely. Further, in the related arts, if the gap is not filled with the resin material 7 completely, that is, void is formed in the gap, the void is expanded by heat in the reflow process so that the resin material 7 is detached or cracked. However, according to the eighth embodiment, the supporting member 4d formed on the semiconductor chip 600 is fixed to the dummy land electrode 6b, the resin material 7 is not detached from the tape substrate 5a or semiconductor chip 600 or not cracked because the distance between the semiconductor chip 600 and the tape substrate 9b is not changed little.

Ninth Embodiment

Figure 17:
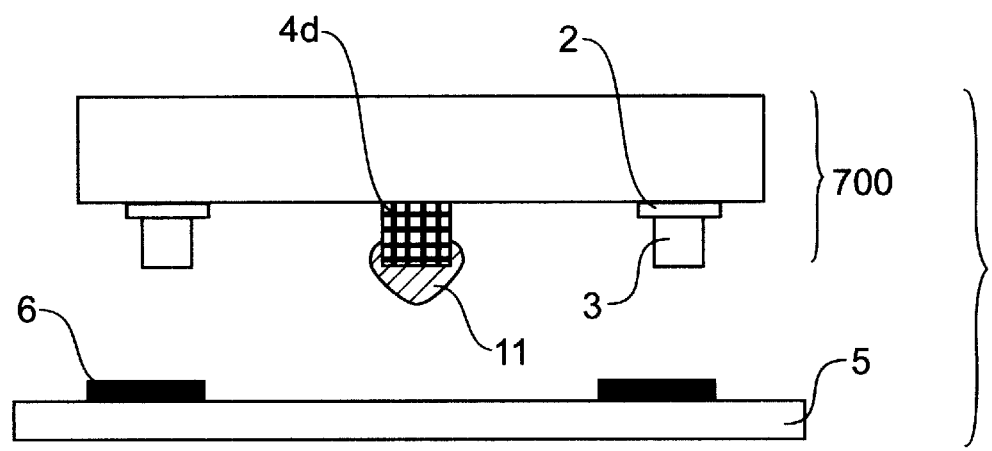
FIG. 17 is a sectional view showing a method how the semiconductor chip shown in FIG. 14 is mounted on the tape substrate, according to the ninth embodiment.

Referring to FIG. 17, a semiconductor chip 700 includes pads 2, bump electrodes 3, a single supporting member 4d, and a connector resin 11. The pads 2, the bump electrodes 3 and the single supporting member 4d are the same components formed on the semiconductor chip 600 according to the sixth embodiment, shown in FIG. 13. Thus, the arrangement of these components, the material of these components and the method of forming these components in the ninth embodiment are the same as these in the sixth embodiment.

Figure 18:
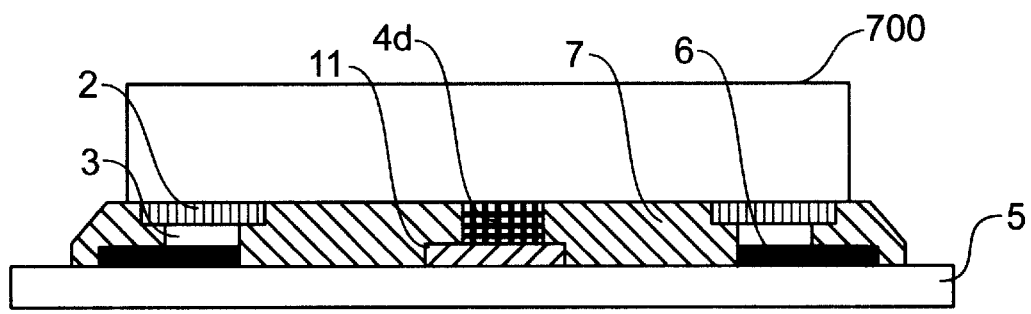
FIG. 18 is a cross-sectional view of a semiconductor package having the semiconductor chip shown in FIG. 14, which is formed by the method shown in FIG. 17.

The connector resin 11 in a liquid state or in a thermal elastic state is formed on the supporting member 4d. As shown in FIG. 18, the semiconductor chip 700 is mounted on the tape substrate 5, and then, the semiconductor chip 700 is fixed on the tape substrate 5 by connecting the bump electrode 3 to a land electrode 6 formed on the tape substrate 5. Simultaneously, the semiconductor chip 700 is fixed on the tape substrate 5 by connecting the support member 4d to the tape substrate 5 with the connector resin 11. The connector resin 11 acts as an adhesive. The connector resin 11 in the liquid state or in the thermal elastic state is, then, solidified. Then, resin material 7 is introduced between a gap formed between the semiconductor chip 700 and the tape substrate 5 in the method described in the first embodiment. The resin material may be introduced before the connector resin material 11 is solidified.

According to the ninth embodiment, the semiconductor chip 700 is fixed to the tape substrate 5 firmly in the area encompassed by the bump electrode 6, the gap between the semiconductor chip 700 and tape substrate 5 can be secured. Thus, the gap can be filled with the resin material 7 completely. Further, as described above, in the related arts, if the gap is not filled with the resin material 7 completely, that is, void is formed in the gap, the void is expanded by heat in the reflow process so that resin material 7 is detached or cracked. However, according to the ninth embodiment, the supporting member 4d formed on the semiconductor chip 700 is fixed to the tape substrate 5 by the connecting resin 11, the resin material 7 is not detached from the tape substrate 5 or the semiconductor chip 700 or not cracked because the distance between the semiconductor chip 700 and the tape substrate 5 is not changed little.

Tenth Embodiment

Figure 19:
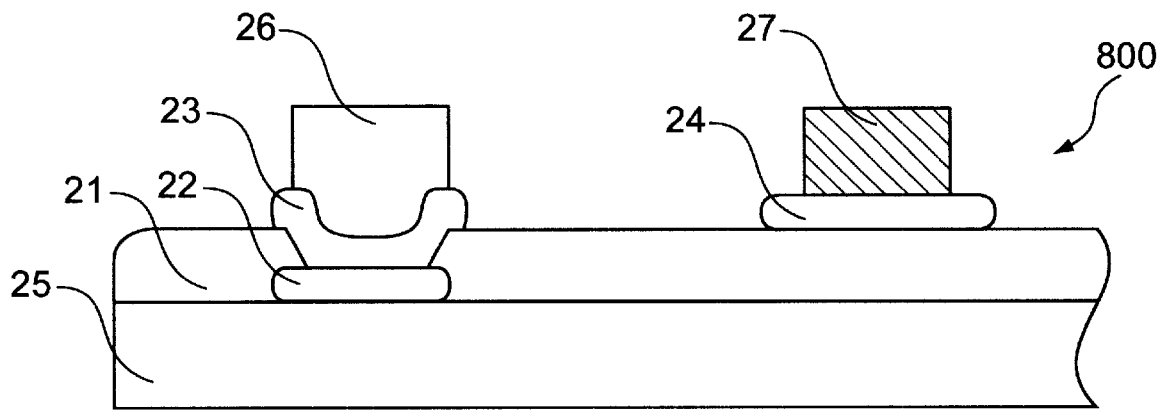
FIG. 19 is a cross-sectional view of a semiconductor chip according to a tenth embodiment of the invention.
Figure 20:
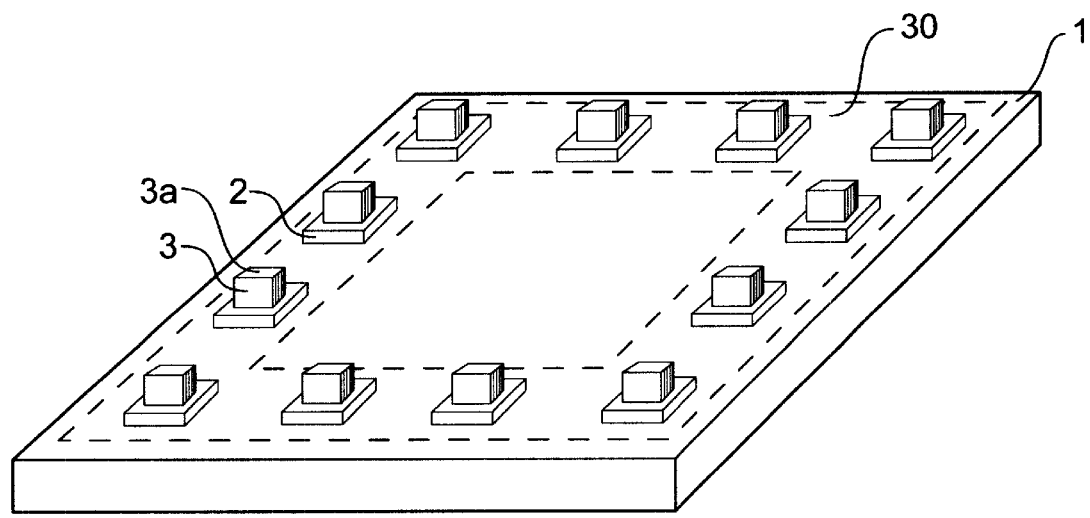
FIG. 20 is a perspective view of a semiconductor chip of the related art.
Figure 21:
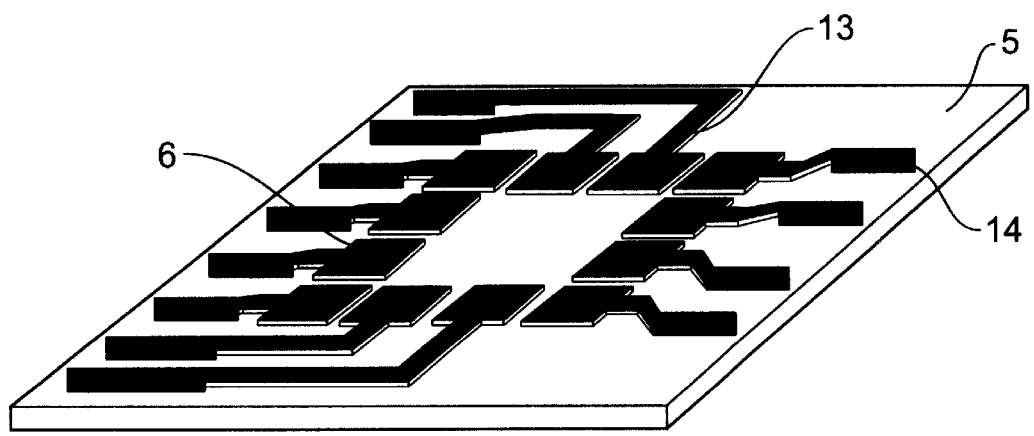
FIG. 21 is a perspective view of a tape substrate of the related art.
Figure 22:
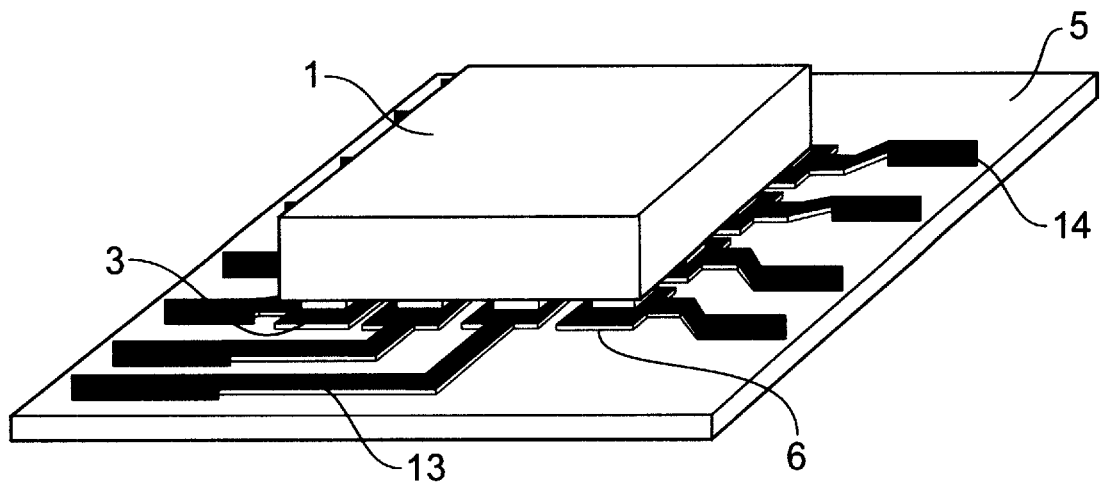
FIG. 22 is a perspective view of the semiconductor chip of FIG. 20, which is mounted on the tape substrate of FIG. 21.
Figure 23:
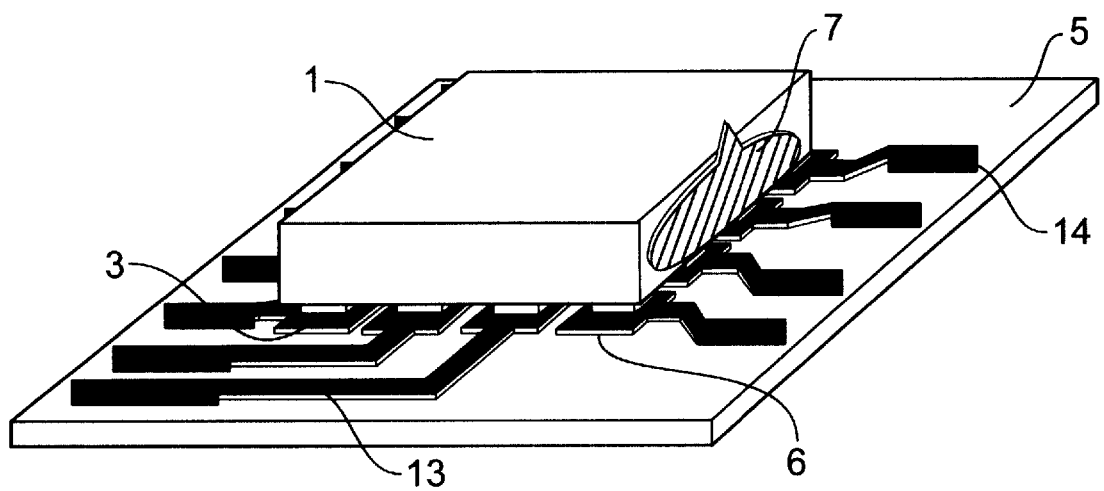
FIG. 23 is a perspective view of the semiconductor chip of FIG. 22 at a start of introducing resin material.
Figure 24:
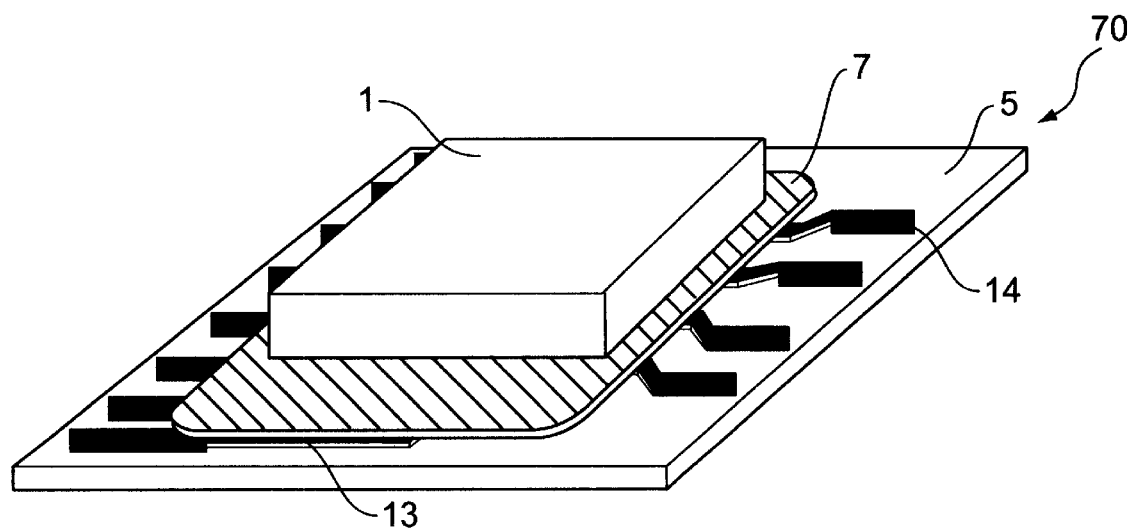
FIG. 24 is a perspective view of the semiconductor chip of FIG. 22 when the introduction of the resin material is completed.
Figure 25:
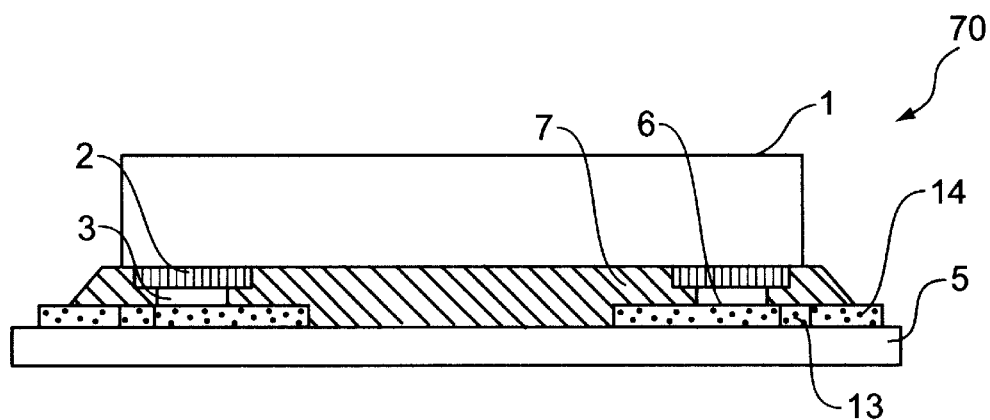
FIG. 25 is a cross-sectional view of the semiconductor chip of FIG. 24.
Figure 26:
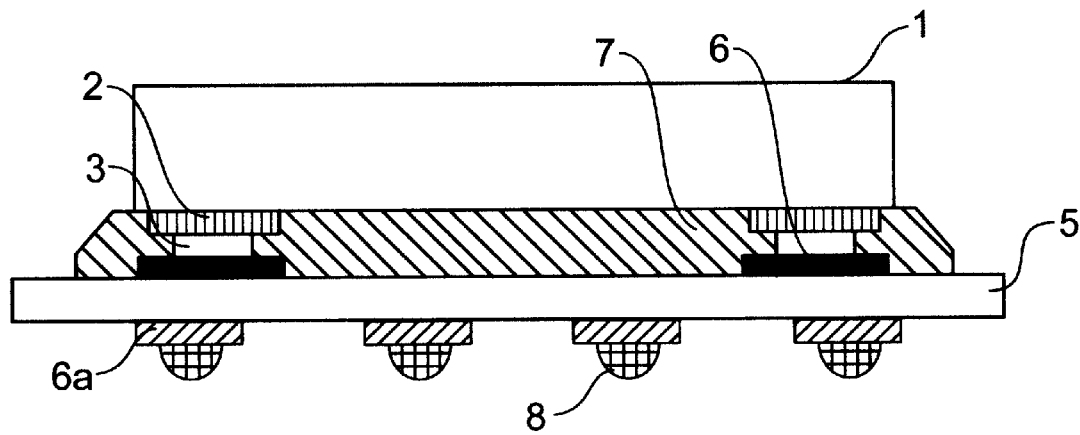
FIG. 26 is a cross-sectional view of a semiconductor package having the semiconductor chip of FIG. 25.
Figure 27:
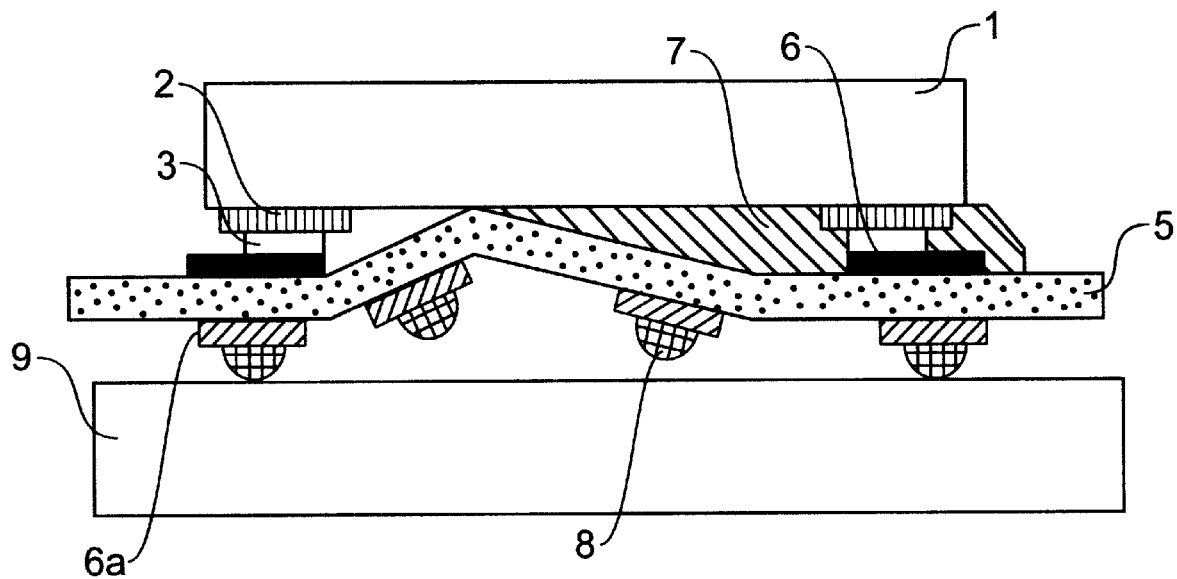
FIG. 27 is a cross-sectional view of a semiconductor package of the related art, which is mounted on an assemble substrate.

Referring to FIG. 19, a semiconductor chip 800 includes a semiconductor substrate 25 on which circuits are formed, a passivation layer 21, an aluminum pad 22, a first barrier metal layer 23, a gold bump electrode 26, a second barrier metal 24, and supporting member 27. The gold bump electrode 26 is formed in a first area along the side of the semiconductor substrate 25 as well as the bump electrode 3 described in the first embodiment. The supporting member 27 is formed in a second area encompassed by the first area, as well as the supporting member 4 described in the first embodiment The semiconductor chip 800 is formed by the following method. The aluminum pad 22 is formed on the semiconductor substrate 25. Then, the passivation layer 21 is formed on the entire surface of the semiconductor chip 800. After that, the passivation layer 21 is etched until the aluminum pad 22 is exposed. Then, the first barrier metal 23 is formed on the aluminum pad 22. Simultaneously, the second barrier metal 24 is formed in the second area. Thus, the first and second barrier metals 23, 24 are formed in the same material, and has a same thickness. Then, the gold bump electrode 26 is formed on the first barrier metals 23, and the supporting member 27 is formed on the second barrier metal 24. The gold bump electrode 26 and the supporting member 27 are formed at the same time. Thus, the material and the thickness of the gold bump electrode 26 and the supporting member 27 are the same.

According to the tenth embodiment, the first and second barrier metal 23, 24 are formed under the bump electrode 26 and the supporting member 27. This structure may be applied to the other embodiments. Further, although gold is used as material to form the bump electrode 26 and the supporting member 27, other material may be used.

While the invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A semiconductor chip, comprising:
   a substrate having a main surface, the main surface including a frame-shaped first area, which is along sides of the main surface, and a second area encompassed by the first area;
   a pad formed in the first area;
   a bump electrode formed on the pad; and
   at least one supporting member formed in the second area, the supporting member being formed of resin material.

2. A semiconductor chip as claimed in claim 1, wherein the at least one supporting member comprises a plurality of supporting members.

3. A semiconductor chip as claimed in claim 1, wherein the supporting member is formed in a center of the second area.

4. A semiconductor chip, comprising:
   a substrate having a main surface, the main surface including a frame-shaped first area, which is along sides of the main surface, and a second area encompassed by the first area;
   a pad formed in the first area;
   a bump electrode formed on the pad; and
   at least one supporting member formed in the second area, wherein the supporting member and the bump electrode are formed of the same material.

5. A semiconductor chip as claimed in claim 4, wherein the support member has a first thickness, the pad has a second thickness, the bump electrode has a third thickness, and the first thickness is substantially equal to the sum of the second and third thicknesses.

6. A semiconductor chip as claimed in claim 4, wherein the support member has a first thickness, the pad has a second thickness, the bump electrode has a third thickness, and the first thickness is less than the sum of the second and third thicknesses.

7. A semiconductor chip as claimed in claim 1, further comprising a connector resin formed on the supporting member.

8. A semiconductor chip as claimed in claim 4, further comprising:
   a first barrier metal formed under the bump electrode; and
   a second barrier metal formed under the supporting member, the first and second barrier metals being formed of the same material, and the first and second barrier metals having the same thickness.

9. A semiconductor package, comprising:
   a main substrate having a main surface, the main surface including a frame-shaped first area, which is along sides of the main surface, and a second area encompassed by the first area
   a pad formed in the first area;
   a bump electrode formed on the pad;
   at least one supporting member formed on the second area, the supporting member having a tip;
   a tape substrate, which has a main surface and a back surface opposite to the main surface, having a land electrode on the main surface thereof, the land electrode is connected to the bump electrode, wherein the tip of the supporting member reaches the main surface of the tape substrate; and
   resin material introduced into a gap, which is formed between the main substrate and the tape substrate.

10. A semiconductor package as claimed in claim 9, wherein the tape substrate further comprises at least one external land electrode formed on the back surface, and a solder ball formed on the external land electrode.

11. A semiconductor package as claimed in claim 10, wherein the external land electrode is arranged under the supporting member.

12. A semiconductor package as claimed in claim 10, wherein:
   the at least one supporting member comprises a plurality of supporting members,
   the at least one external land electrode and the solder ball thereon comprise a plurality of external land electrodes and solder balls,
   the number of supporting members is the same or less than the number of external land electrodes, and
   each supporting member is located above one of the external land electrodes.

13. A tape substrate, comprising:
   a tape having a main surface, the main surface including a frame-shaped first area, and a second area encompassed by the first area;
   a land electrode formed in the first area;
   an I/O electrode formed in the first area;
   a wiring pattern formed in the first area, the wiring pattern connecting the land electrode to the I/O electrode;
   a resist pattern formed on the wiring pattern; and
   at least one supporting member formed in the second area, wherein the support member has a first thickness, the wiring pattern has a second thickness, the resist pattern has a third thickness, and the first thickness is substantially the same as the sum of the second and third thicknesses.

14. A tape substrate as claimed in claim 13, wherein the supporting member is formed in a center of the second area.

15. A tape substrate as claimed in claim 13, wherein the at least one supporting member comprises a plurality of supporting members.

16. A tape substrate as claimed in claim 13, wherein the supporting member and the resist pattern are formed of the same material.

17. A tape substrate as claimed in claim 13, wherein:
   the supporting member comprises a first supporting member and a second supporting member formed on the first supporting member,
   the first supporting member and the wiring pattern have the same thickness and are formed of the same material, and
   the second supporting member and the resist pattern have the same thickness and are formed of the same material.

* * * * *